(12) United States Patent
Bode et al.

(10) Patent No.: US 6,531,184 B2
(45) Date of Patent: Mar. 11, 2003

(54) PROCESS FOR COATING ON PRINTING CYLINDERS

(75) Inventors: Udo Bode, Dreieich (DE); Michael Zwilling, Darmstadt (DE)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/851,551

(22) Filed: May 9, 2001

(65) Prior Publication Data

US 2002/0018857 A1 Feb. 14, 2002

(30) Foreign Application Priority Data

May 18, 2000 (EP) ............................. 00110644

(51) Int. Cl.⁷ ................................. B05D 3/02
(52) U.S. Cl. .................... 427/385.5; 427/145; 427/428; 118/46; 118/232; 101/216; 101/217; 101/328
(58) Field of Search ................. 427/144, 145, 427/146, 385.5, 401.1, 409, 411, 417, 428, 508; 118/46, 200, 230, 232, 233, 244, 255, 258, 268; 101/213, 216, 217, 328

(56) References Cited

U.S. PATENT DOCUMENTS

| 4,323,637 A | | 4/1982 | Chen et al. |
| 4,427,759 A | | 1/1984 | Gruetzmacher et al. |
| 4,460,675 A | | 7/1984 | Gruetzmacher et al. |
| 4,808,445 A | * | 2/1989 | Fujiwara et al. ............ 118/249 |
| 4,894,315 A | | 1/1990 | Feinberg et al. |
| 5,279,861 A | * | 1/1994 | Shigeta ........................ 118/258 |
| 6,022,152 A | * | 2/2000 | Fassler et al. .............. 118/244 |

FOREIGN PATENT DOCUMENTS

| DE | 2844426 | | 1/1989 |
| EP | 0654150 | | 3/1997 |
| EP | 0 654 150 B1 | * | 5/1997 |
| EP | 0767407 | | 5/2000 |
| WO | WO 94/03838 | | 2/1994 |
| WO | WO 94/03839 | | 2/1994 |
| WO | WO 96/16356 | | 5/1996 |

* cited by examiner

Primary Examiner—Shrive P. Beck
Assistant Examiner—Rebecca A. Blanton
(74) Attorney, Agent, or Firm—Thomas H. Magee

(57) ABSTRACT

A non-impact process and apparatus for coating printing cylinders with layers of a coating liquid, especially for coating flexographic printing sleeves with infrared sensitive layers.

18 Claims, No Drawings

PROCESS FOR COATING ON PRINTING CYLINDERS

FIELD OF INVENTION

This invention relates to a process for coating printing cylinders with a layer of a liquid, especially for coating flexographic printing sleeves with infrared sensitive layers. Furthermore, the invention relates to an apparatus for this process and to a flexographic printing sleeve made by this process.

BACKGROUND OF INVENTION

Flexographic printing forms are well known for use in relief printing and letterpress printing on a variety of substrates such as paper, corrugated board, films, foils, and laminates. Flexographic printing forms can be prepared from photopolymerizable elements which generally comprise a photopolymerizable layer of an elastomeric binder, a monomer, and a photoinitiator as main components, interposed between a support and a cover sheet or multilayer cover element. Upon imagewise exposure with actinic radiation through a photomask, the exposed areas of the photopolymerizable layer are insolubilized. Treatment with a suitable solvent removes the unexposed areas of the photopolymerizable layer leaving a printing relief which can be used for flexographic printing. Such materials are described in U.S. Pat. No. 4,323,637; U.S. Pat. No. 4,427,759; and U.S. Pat. No. 4,894,315.

Digital methods and associated recording materials that do not require a photomask have been developed and are described in WO 94/03838, WO 94/03839, WO 96/16356, and EP 0767 407. Such recording materials comprise a conventional photopolymerizable layer, as previously described, and additionally a layer capable of forming an integrated photomask. The additional layer is sensitive to infrared radiation and opaque to actinic radiation, a so-called infrared sensitive layer. This infrared sensitive layer is imaged digitally, whereby the infrared sensitive material is imagewise vaporized or transferred to a superposed film. Subsequent overall exposure of the photopolymerizable element through the resulting integrated photomask, washing off unpolymerized areas and remaining areas of the infrared sensitive layer, and drying the element yield a flexographic printing form.

These digital methods are used for the preparation of flexographic printing forms in sheet form or in cylindrical form. For flexographic printing forms which are cylindrical, the photopolymerizable layer is on a cylindrical shaped carrier, a so called sleeve. Sleeves are readily and repeatably mounted and dismounted from print drums. Such sleeves are described in EP 0 696 247. Besides the advantages associated with printing production for easily mountable and dismountable printing forms, there are particular applications and advantages to using the printing form in cylindrical form. Continuous printing forms have applications in flexographic printing of continuous designs such as in wallpaper, decoration and gift wrapping paper. Furthermore, such cylindrical printing forms are well-suited for mounting on laser exposure equipment where it can replace a drum or be mounted on the drum for exposure by a laser.

For digital laser imaging, a cylindrical printing element must be coated with a thin layer sensitive to laser radiation used for the imaging process. Currently, coatings on elastomeric and soft flexographic printing cylinders or sleeves are done by two methods (a) ring coating and (b) spray coating.

Ring coating is a method which touches the cylinder or sleeve, therefore, it is usually only applied for hard and solid gravure printing cylinders. Trials to coat on soft and elastomeric flexographic printing sleeves have been tried in the past, but often damages and scratches the soft and tacky surfaces of the elastomeric flexographic printing sleeves. The problem is that the photopolymerizable layer on the sleeve is coated before UV exposure and processing, therefore, is unhardened and soft during coating and very sensitive for mechanical damages. In addition, is was found that the coating is uneven from top to bottom, with a lower coating weight at the top versus the bottom, due to upright standing of the printing cylinder and fluid flow down to the end of the sleeve during coating. This is a severe problem especially with slow drying coating liquids. Other disadvantages of ring coating are the unclean coating at the edges (of sleeve start and end), further the low yield (due to remaining coating liquid in the coating container) and the high cleaning effort after coating.

Consequently, a coating technology like spray coating is preferred for soft surfaces. However, spray coating of thin layers is difficult to achieve and needs special spray nozzles to cover the cylindrical sleeve with the coating uniformity requested for the laser imaging process. Due to the request for uniform coverage, the spray process has to be applied in several passes to obtain pinhole-free coatings. Especially, for small sleeve diameters the spray cone is much larger than the sleeve geometry; this leads to significant overspray and loss of spray liquid. At the edges (sleeve start and end) unclean overspraying is observed if the edges are not covered with a tape. Further, the flammability of the spray droplets has to be considered when flammable solvents are used for the coating. This can be a significant safety hazard and needs specific protection for the equipment.

Another coating technique that touches the surface of the printing cylinder is roller coating. A coating liquid is transported by a coating roll to the surface that is going to be coated, whereby the coating roll is in close contact with this surface or even pressed against it. A special roller coating method is described in U.S. Pat. No. 5,279,861. This method comprises such a roller coating wherein a rotating coating roll, immersed in the coating liquid, is contacted with a rotating printing cylinder and moved from one end of the printing cylinder to the other in such a manner that the coating roll is kept in contact with the printing cylinder and the coating liquid is coated on the printing cylinder.

But this method is only applicable to hard and solid gravure printing cylinders. Flexographic printing cylinders can not be coated by this process because their tacky and soft photopolymerizable surfaces can not be coated without any scratches or surface defects. These defects would later show up as defects in the printed image, making the printing cylinder unusable.

SUMMARY OF INVENTION

Therefore, it was an objective of the present invention to provide a coating process that does not damages the surface of the printing cylinder to be coated and which provides uniform coatings.

This objective is solved by a process for coating a printing cylinder with a layer of a liquid, comprising the steps of: (a) forming a fluid film of the liquid on a surface of a coating roll; (b) positioning the surface of the coating roll in a predetermined distance from an outer surface of the printing cylinder such that the fluid film contacts the outer surface and a coating gap between the outer surface of the printing cylinder and the surface of the coating roll is formed; (c) simultaneously rotating and moving the coating roll relative to the printing cylinder in such a manner that the printing cylinder is coated with the liquid layer; and (d) drying the liquid layer to form the coated printing cylinder.

In another embodiment, the invention is directed to an apparatus to perform this process.

In a further embodiment, the invention is directed to a flexographic printing sleeve made by such a process.

DETAILED DESCRIPTION OF INVENTION

The present invention provides a coating process for printing cylinders which have tacky, and therefore very sensitive, surface. Printing cylinders are cylindrical shaped photopolymerizable printing elements. This process is preferably used for soft and elastomeric cylindrical shaped photopolymerizable printing elements supported by a sleeve. Such elements are called printing sleeves. It is especially used for flexographic printing sleeves. For printing elements include a photopolymerizable layer which is soft and elastomeric, the photopolymerizable layer may be a sheet on a cylindrically shaped support or a continuous layer formed into a cylindrical shape which may be on a cylindrical support.

The main advantage of the present process is the non-impact mode, so that sensitive surfaces like the soft and tacky photopolymerizable surfaces of flexographic printing cylinders and sleeves can be coated without any scratches or surface defects. No defects appear in printed images. Therefore, for high quality printing, the present non-impact coating process provides excellent printing cylinders and sleeves. A further advantage of the present process is a very high uniformity of the coated layer over the whole length of the printing cylinder. Especially for infrared sensitive photomask layers, a very high uniformity of their optical density for ultraviolet and infrared light can be achieved over the whole length of the printing cylinder.

General Process

The process of this invention uses a rotating coating roll which transports a fluid film of a liquid, the coating liquid, to an outer surface of a printing cylinder. The printing cylinder is supported at both of its longitudinal ends in position preferably by chucks, but can be by any means suitable to support the rotation of the printing cylinder. The coating roll is immersed in a container containing the coating liquid to the extent necessary so that a fluid film of the coating liquid forms on the surface of the coating roll when the roll is rotated. The surface of the coating roll is positioned in a predetermined distance from an outer surface of the printing cylinder such that the fluid film contacts the outer surface of the printing cylinder and a coating gap between the outer surface of the printing cylinder and the surface of the coating roll is formed. The surface of the rotating printing cylinder is brought into contact with the fluid film but not with the coating roll. The fluid film contacts and spreads on the surface of the printing cylinder. Simultaneous rotating of printing cylinder, and rotating and moving of the coating roll coats a thin layer of the coating liquid onto the surface of printing cylinder. Preferably a longitudinal axis of the coating roll is perpendicular to a longitudinal axis of the printing cylinder.

A gap of the thickness of the fluid film is adjusted between the surface of the printing cylinder and the outer surface of the coating roll. Both surfaces do not touch. The gap between them is filled with the coating liquid. Direct contact between the coating roll and the printing cylinder would destroy the surface of the sensitive photopolymerizable layer on the cylinder. This is avoided by adjusting a gap just sufficient to wet the surface with the coating liquid. Therefore, due to this gap the printing cylinder remains free from scratches or mechanical damage. The width of the coating gap is about 30–800 $\mu$m, preferably about 40–160 $\mu$m. Especially, coating gaps with a width of 50–100 $\mu$m are suitable. In this coating gap, the fluid film of the coating liquid splits into two parts. One part of the coating liquid spreads on the printing cylinder surface and adheres there. The other part remains on the coating roll surface. By the varying the width of the coating roll, it is possible to meter the fluid film.

The uniformity and thickness of the coating can be controlled by rotation of the printing cylinder, rotation of the coating roll and linear speed of a coating table, which supports the coating roll and the container for the coating liquid. Faster roll rotation results in higher wet coating weight. The method coats very clean edges at coating start and end of the cylinder simple by moving the coating roll up and down for start and finish.

Preferably, the coating liquid is applied overlapping for complete coverage and rapid levelling. After levelling and drying, a uniform layer on the printing cylinder is provided. Especially by spirally applying of the coating liquid, it is possible to provide a uniform, overlapping coating on the printing cylinder. Only one coating pass is needed which makes the whole coating process very fast and convenient. No change in coating weight along the length of the printing cylinder are observed; uneven coatings which are a problem with ring coating are avoided. Then the coating trail levels out and dries. As the printing cylinder rotates during drying, the coating dries much faster than on a non-rotating printing cylinder as with ring coating. The most convenient drying is under ambient conditions at temperatures of 18–24° C. and relative humidities of 20–80% (room climate conditions). Relative humidities of 30–60% are preferred for faster drying. Also, to speed up the drying time, hot air can be applied, e.g. air temperatures of 24–40° C. can be used. If no hot air is available and drying is under ambient conditions the air can be moved or circulated or the printing cylinder can be rotated at higher speed than during the coating process. To avoid dirt and dust contamination of the coated layer during the coating or drying cycle the air should be filtered. After drying, a very uniform thin coating is obtained on the printing cylinder.

In a similar way, multiple layers can be applied by overcoating a pre-coated layer in a second pass. If needed, different coating solutions can be coated by repeating the coating and drying cycles. Different coating weights can be adjusted by changing the coating roll rotation accordingly. Multiple coatings are beneficial if additional functional layers have to be integrated underneath or on top of the digitally imageable infrared sensitive layer, e.g. a release layer underneath the digitally imageable infrared sensitive layer for improved ablation and low stain and/or higher laser sensitivity and faster laser imaging. These features are important for customers convenience and high-quality flexographic printing forms.

Coating Roll

The coating roll of this invention is preferably made of hard, non-elastic materials, such as, for example, specific plastics, metals, and ceramic materials. Furthermore, the coating roll material must be insoluble in and resistant to the organic solvents used for the coating liquid, like alcohols, esters, ketones, aromatic and aliphatic hydrocarbons. Sponge like and foamed materials are not suitable, because these materials are very sensitive to penetration and swelling of organic solvents. As a consequence of swelling, these roll materials will change their geometry, especially their diameter. This makes them unusable for the precision coating process of the present invention as the gap will change depending on the solvent uptake. Coating rolls made of such materials do not run round due to change and deformation of their roll geometry.

Typically, the coating roll materials which are suitable for the present coating process have a Shore D hardness measured according to ASTM D 2240 of at least 60, preferably of at least 70. Preferred are metals, like stainless steel and thermoplastic and thermosetting non-elastomeric polymers, like polyethylene, polypropylene, polyamides, polyesters, polycarbonates, polyurethane resins, ABS resins, polyacrylates, and polymethacrylates. Typically used are polyamides, like Nylon(, and polyesters, like polyethylene terephthalate. The surface of the coating roll can be smooth or can carry a screen or a line pattern. Also, a coating roll with gravure patterns, as known in the art of gravure printing, can be used. The fluid film transported to the printing cylinder can be metered by using such patterned surfaces. Typically, the coating roll has a roll diameter of 60–200 mm, preferably 90–150 mm. Especially, coating rolls with a diameter of 100–120 mm are used. Typically, the coating roll has a roll width of 5–50 mm, preferably 10–40 mm. Especially, coating rolls with a width of 20–30 mm are used.

Printing Cylinder

In general, all kinds of printing cylinders may be coated by the process of the present invention. Preferably printing cylinders from metal or plastic covered with a seamless photopolymerizable printing layer may be used. Especially, seamless elastomeric flexographic printing cylinders and sleeves can be used. Sleeves are hollow cylinders usually made of plastic materials. These sleeves are readily and repeatably mounted and dismounted from printing drums, preferably by being expandable using pressurized air. Non-elastic, transparent or non-transparent, base sleeves can carry additional layers for enhancing printing quality. Typical sleeves which can be used within the meaning of the present invention are disclosed in EP 0 696. Seamless printing cylinders and seamless printing sleeves are usually made by wrapping a flat photopolymerizable printing plate around a printing drum or a sleeve, and joining the edges together to form a seamless, continuous element. Such a process is disclosed in DE 28 44 426.

The photopolymerizable layers of such flexographic printing cylinders are prepared from known photopolymerizable materials. All photopolymerizable materials of the state of the art can be used. They usually comprise at least one elastomeric binder, at least one photopolymerizable, ethylenically unsaturated monomer, and at least one photoinitiator or photoinitiator system.

Examples of elastomeric binders are polyalkadienes, alkadiene/acrylonitrile copolymers; ethylene/propylene/alkadiene copolymers; ethylene/(meth)acrylic acid((meth)acrylate copolymers; and thermoplastic, elastomeric block copolymers of styrene, butadiene, or isoprene. Linear and radial thermoplastic, elastomeric block copolymers of styrene and butadiene or isoprene are preferred. The quantity of binder is preferably 65% by weight, relative to the total weight of the photopolymerizable material.

Useful monomers are the conventional ethylenically unsaturated, copolymerizable, organic compounds, such as, for example, acrylates and methacrylates of monovalent or polyvalent alcohols; (meth)acrylamides; vinyl ethers and vinyl esters; etc., in particular acrylic and/or methacrylic of butanediol, hexanediol, diethylene glykol, trimethylol propane, pentaerythritol, etc.; and mixtures of such compounds. The monomer quantity is preferably at least 5% by weight, relative to the total weight of the photopolymerizable material.

Suitable photoinitiators are individual photoinitiators or photoinitiator systems, such as, for example, benzoin derivatives, benzil acetals, diarylphosphine oxides, etc., also mixed with triphenyl phosphine, tertiary amines, etc. The quantity of photoinitiator is usually 0.001–10% by weight, relative to the total weight of the photopolymerizable material.

In addition to the main components described in the foregoing, the photopolymerizable compositions may comprise conventional additives like, for example, UV absorbers, thermal stabilizers, plasticizers, and fillers.

Especially preferred are the materials disclosed in U.S. Pat. No. 4,323,637; U.S. Pat. No. 4,427,759; and U.S. Pat. No. 4,894,315.

Additional layers may be present on top of the photopolymerizable material. Especially barrier layers like those described in EP 0 654 150 are used. Such barrier layers comprise layers which are insensitive to actinic radiation and also such layers which are photosensitive themselves. Examples for the first type of barrier layers are those materials which are conventionally used as release layers, such as, for example, polyamides, polyvinyl alcohols, copolymers of ethylene and vinyl acetate, etc. Polyamides are especially preferred. Examples for the second type of barrier layers are photosensitive layers, comprising preferably an elastomeric binder, a monomer, and a photoinitiator, or such layers which become photosensitive when contacted with the photopolymerizable layer and which comprise an elastomeric binder and optionally fillers or other additives, but no monomer. Suitable layers are those disclosed as elastomeric layers in the multilayer cover element described in U.S. Pat. No. 4,427,759 and U.S. Pat. No. 4,460,675.

A protective coversheet may be on the photopolymerizable layer and removed prior to application coating of the infrared sensitive material. After the infrared sensitive material is coated on the photopolymerizable layer, the printing cylinder may further include a removable coversheet to protect the outermost layer, i.e. infrared sensitive layer.

Coating Liquid

All kinds of coating materials can be used as coating liquids in the process of the present invention such as, for example, protective materials, infrared sensitive materials, materials curable by exposure to ultraviolet radiation, etc. Preferably infrared sensitive, especially infrared ablatable materials, can be applied to printing cylinders or sleeves by this process. Layers resulting from such materials can be laser imaged resulting in an integrated photomask for the printing cylinder.

The preferred infrared sensitive materials are soluble or dispersible in a developer, opaque to ultraviolet or visible light, that is, has an optical density about at least 2.5, and can be imaged with an infrared laser. These materials comprise compounds having high infrared absorption in the wavelength range between 750 and 20,000 nm, such as for example, polysubstituted phthalocyanine compounds, cyanine dyes, merocyanine dyes, etc., inorganic pigments, such as, for example, carbon black, graphite, copper chromite, chromium dioxide, etc., or metals, such as, for example, aluminium, copper, etc. The quantity of infrared absorbing compound is usually 0.1–50% by weight, relative to the total weight of the material. To achieve the optical density of about at least 2.5 with actinic radiation, the infrared sensitive materials contain a compound that prevents the transmission of actinic radiation, such as, for example, dyes, organic ultraviolet absorbers such as, for example, hydroxybenzophenones, hydroxyphenylbenzotriazoles, hydroxyphenyl-s-triazines, oxalanalides, etc. or pigments, in particular the aforesaid inorganic pigments like carbon black, graphite, titanium dioxide, zinc oxide, etc. The quantity of this compound is usually 1–70% by weight relative to the total weight of the material. The infrared sensitive material contains optionally a polymeric binder, such as, for example, nitrocellulose, cellulose acetate butyrate, polyvinyl butyrates, polyurethanes, polyvinyl acetates, homopolymers or copolymers of acrylates, methacrylates, and styrenes, polyamides, polyvinyl alcohols, thermoplastic elastomeric polymers like linear and radial block copolymers of styrene and butadiene or isoprene, cyclic rubbers, etc. Other auxiliary agents, such as, for example, plasticizers, levelling agents, defoaming agents, viscosity builders, substrate wetting additives, anti-blocking additives, pigment dispersants, slip additives, etc. are possible. These compounds may be solved in conventional solvents. Typically solvents like water, alcohols, esters, ketones, hydrocarbons, or mixtures thereof are used. Suitable infrared sensitive materials are those disclosed in WO 94/03838 and WO 94/03839.

The infrared sensitive materials are usually coated onto the photopolymerizable layer of the printing cylinder or sleeve by the process of the present invention. It is also possible to coat it onto an elastomeric layer or onto a release layer as described above. By the process of the present invention, infrared sensitive layers can be coated on tacky photopolymerizable surfaces with excellent uniformity and no surface scratches or other damages. The variations of optical densities (OD) in the range of OD=2.50–5.00 are better than +/−5% from start to end of the printing cylinder. This corresponds to typical dry coating weights in the range of 5–50 mg/dm$^2$, preferably 20–40 mg/dm$^2$ with corresponding high uniformities required for a clean laser ablation and, consequently, needed for a high flexographic print quality Detailed Description of Process and Apparatus A coating head of an apparatus of the present invention consists of the coating roll described above and a container for the coating liquid, both mounted on a coating table. The coating table can be moved by controller driven motors in lateral direction, left and right, parallel to the horizontal axis of the printing cylinder. Further, it can be moved by motors up and down, so that the coating roll can be moved upwards or downwards relative to the printing cylinder surface. The coating roll dips with the lower part into the coating liquid which is filled into the container.

The complete coating process consists of a measuring cycle, a positioning cycle, a coating cycle and a drying cycle. During the measuring cycle a software program determines via two high precision fibre optical sensors the relative position of the cylinder surface versus the surface of the coating roll and in addition the start point for coating on the printing cylinder. Then the software controlled motors move the coating head into the coating start position: left or right to the point of coating start and up so that between the surface of the coating roll and the outer surface of the printing cylinder a pre-determined coating gap of 30–800 $\mu$m is maintained during the coating cycle. The coating is applied by simultaneous rotation of printing cylinder and coating roll and horizontal movement of the coating head. All speeds are pre-adjusted and maintained at high precision during the coating cycle. As the coating result, a more or less overlapping spiral is coated on the printing cylinder. When the coating is completed the coating head moves down and the drying continues, optional at a faster printing cylinder rotation. The coated layer is coated as a spiral resulting from the combination of printing cylinder rotation and linear coating head (coating roll) movement along and parallel to the printing cylinder axis. Basically, the coating spiral can be too wide (less than 100% coverage), trail beside trail (100% coverage) or too narrow (overlapping of neighbouring trails). The coating spiral is too wide with uncovered areas when the coating head speed is fast and/or the printing cylinder rotation is slow or too slow for a given linear coating head speed. The spiral has to be coated in a way that the coating trail will not leave uncovered areas. It was observed that overlapping of 20–80%, preferably 30–50%, of the coating trails will result in a faster levelling and improved coating uniformity, however, higher overlapping will apply more coating solution to the printing cylinder and result in higher coating weights. The width of the coating trails is depending on the coating gap and the coating roll rotation. The smaller the gap and the faster the coating roll rotation, the broader the width of the coating trail. Therefore, all four settings will influence uniformity and coating weight of a specific coating solution.

High coating accuracy from start to end and high sleeve-to-sleeve reproducibility can be achieved by the new coating technology due to the possibility to use a sensor positioning system of fibre optic sensors which measure printing cylinder dimensions, printing cylinder diameter, printing cylinder position and coating roll position with high precision. With these data the machine software adjusts coating parameters, printing cylinder rotation and coating table speed for constant coating weight. Precision gap control for roller position is provided with good repeatability. In addition to the software controlled gap adjustment a mechanical gap adjustment is part of the coating head. This feature is used for gap calibration, gap re-adjustment or if the software gap setting needs a correction. It makes new gap settings or changing of gap settings convenient and easy. No new software programming is required if the gap distance needs to be changed for a single coating process or a special coating adjustment. The mechanical adjustment is performed by a micrometer which allows changes between coating roll and printing cylinder surface with an accuracy better than 5 $\mu$m which is sufficient to achieve the desired coating uniformity. The position is displayed and can be monitored by a 3-digit read-out. A wide variety of printing cylinders with different diameters and lengths can be used wit the coating apparatus of the present invention.

Industrial Utility

The printing cylinder coated by the process of the present invention is directly ready for further processing. In case that photopolymerizable printing cylinders or sleeves have been coated with an infrared sensitive layer, such processing usually comprise the steps of imagewise exposure of the infrared sensitive layer, overall exposure with actinic radiation of the photopolymerizable layer through the imaged infrared sensitive layer, development with a suitable wash off solvent, drying, and post treatment. First, the infrared sensitive layer is exposed with an infrared laser, for example, a diode laser emitting between 750 and 880 nm, preferably 780 and 850 nm, or a YAG laser emitting at 1060 nm. The optional strippable cover sheet may be removed prior to the laser exposure, in which case the laser vaporizes the infrared sensitive layer. If the coversheet remains on the photopolymerizable printing cylinder, the exposure by laser removes the infrared sensitive layer to the overlying coversheet and is stripped off upon removal of the coversheet. The photopolymerizable printing cylinder is exposed overall with convential radiation sources, such as, for example, xenon lamps, carbon arc lamps, mercury vapor lamps, fluorescent lamps having phosphors emitting UV radiation, etc. The unpolymerized areas can be washed off, depending on the binder system, with water, aqueous or semi-aqueous solutions, or suitable organic developer solvents, such as, for example, aliphatic or aromatic hydrocarbons, terpenes, toluene, halogenated hydrocarbons, etc., or mixtures of the named solvents. Additives, such as surfactants or alcohols are possible. This step removes the unphotopolymerized areas of the photopolymerizable printing cylinder, the remaining areas of the infrared sensitive layer, and a barrier layer that may optionally be present. After drying, the resulting flexographic printing cylinder can be post-exposed and/or chemically or physically treated in any sequence to prepare a non-tacky printing surface. These process steps are thoroughly described in WO 94/038383 or WO 94/03839. Continuous printing forms made by this process have applications in the flexographic printing of continuous designs such as in wall-paper, decoration and gift wrapping paper.

EXAMPLES

The following examples illustrate the invention, but do not limit it The average molecular weights of the polymers are given as weight average (Mw).

Example 1

A coating solution of an infrared sensitive material was prepared in the following way: a solvent soluble thermoplastic polyamide resin with a softening point of about 140° C. and an average molecular weight Mw of 20,000 was dissolved in a solvent blend with a high-shear dissolver. The dissolver disk rotated with a tip speed of 16 m/sec. A carbon black pigment was added and dispersed into this polymer resin solution. The concentration was adjusted to 36% by weight of total solids. This polymer/pigment dispersion was milled in a media mill in 4 passes at a mill base throughput of 90 kg/h. After milling the pigment concentrate was diluted under high-shear with the dissolver. During diluting, coating additives were added in the following sequence: a defoaming additive, a substrate wetting additive and a viscosity builder. The concentration was adjusted to 4.8% by weight of total solids.

This coating solution was filled into the container of the coating machine so that the coating roll dipped with its lower part to about 40% into the coating fluid. The machine was set for the following coating conditions: printing cylinder rotation 30 rpm, linear coating head speed 17.5 cm/min, coating roll rotation 21.5 rpm. A printing cylinder was used covered with a thin seamless layer of Cyrel® HORB (E.I du Pont de Nemours & Company, Wilmington, Del.) photopolymerizable material.

A coating roll A was used made from solid Nylon®, diameter 110 mm, width 28 mm, roundness accuracy about 0.01 mm, surface roughness Rz=1.6/1. The coating was applied in a way that the coating roll did not touch the surface of the printing cylinder (non-impact coating mode); the gap distance was adjusted to 60 µm between the tacky HORB surface and the Nylon® coating roll. The coating was dried with heated air of 26° C. and relative humidity of 29%. The coating was rub-resistant after about 40 min. A very uniform highly glossy black layer was achieved with no coating defects. The layer was peeled off with a clear tape and the optical density (OD) profit was measured with a transmission densitometer in coating direction parallel to the axis of the printing cylinder. Also the dry coating weight was determined by lifting and peeling off the photomask layer from the HORB photopolymerizable layer.

Results for coating solution coated with coating roll A and gap adjustment of 60 µm measured coating weight

| | |
|---|---|
| along the OD profil | 28 mg/dm$^2$ |
| measured average OD along the OD profil | 3.12 |
| min/max OD | 3.05/3.29 |
| difference max–min OD | 0.24 |
| levelling of coating complete levelling | |
| coating spiral structure | none |
| mechanical scratches on the photopolymerizable layer | none |

The prepared infrared sensitive layer showed excellent coating quality and OD uniformity. The infrared sensitive layer was laser imaged with an Nd:YAG laser at 1064 nm. After processing a printing cylinder for high-quality flexographic printing was obtained.

Comparative Example 1

In a second experiment, the coating solution of Example 1 was used with the same coating and drying conditions as given in Example 1. The printing cylinder had the same geometries and was prepared in the same way as described in Example 1, also covered with Cyrel® HORB photopolymerizable material. A coating roll B was used made from flexible foamed polyurethane, diameter 110 mm, width 28 mm. This coating roll was adjusted in a way that the roll was pressed against the unexposed and tacky photopolymerizable surface; the flexible roll was deformed and the deformation was adjusted to about 1 mm displacement (impact coating mode).

Results for coating solution coated with coating roll B and displacement of 1 mm

| | |
|---|---|
| measured coating weight along the OD profil. | 31 mg/dm$^2$ |
| measured average OD along the OD profil | 3.28 |
| min/max OD | 2.64/3.69 |
| difference max–min OD | 1.05 |
| levelling of coating insufficient levelling | |
| coating spiral structure | yes |
| mechanical scratches on the photopolymer | yes |

The infrared sensitive layer showed the spiral coating structure of the coating trails; a glossy trail alternated with a matte trail. The levelling was insufficient. The layer showed significant differences for the measured OD: highest 3.69, lowest 2.64. An unacceptable high difference of optical density ($\Delta$=1.05) was measured. Due to mechanical scratches from the coating roll on the surface of the unexposed, tacky photopolymerizable layer, the printing cylinder could not be used.

What is claimed is:

1. A process for coating a printing cylinder with a layer of a liquid, comprising the steps of:

(a) forming a fluid film of the liquid on a surface of a coating roll;
(b) positioning the surface of the coating roll a predetermined distance from an outer surface of the printing cylinder such that the fluid film contacts the outer surface and a coating gap between the outer surface of the printing cylinder and the surface of the coating roll is formed;
(c) simultaneously rotating and moving the coating roll relative to the printing cylinder in such a manner that the printing cylinder is coated with the liquid layer, wherein the fluid film on the coating roll is split into two parts by adjusting the coating gap between printing cylinder and coating roll; and
(d) drying the liquid layer to form the coated printing cylinder.

2. The process according to claim 1, characterized in that the printing cylinder is rotationally supported at both ends.

3. The process according to claim 1, characterized in that the width of the predetermined distance between printing cylinder and coating roll is about 30–800 μm.

4. The process according to claim 1, characterized in that the coating roll is rotated and moved from one end of the printing cylinder toward the other end of the printing cylinder in such a manner that a uniform overlapping spiral of the fluid film is formed on the printing cylinder.

5. The process according to claim 4, characterized in that the trails of the overlapping spiral of the fluid film have an overlap of 20–80%.

6. The process according to claim 1, characterized in that the printing cylinder comprises a photopolymerizable elastomeric printing layer.

7. The process according to claim 6, characterized in that the photopolymerizable elastomeric printing layer is cylindrically disposed on a sleeve.

8. A process for coating a printing cylinder with a layer of a liquid, comprising the steps of:
(a) forming a fluid film of the liquid on a surface of a coating roll, characterized in that the coating roll comprises a material having a predetermined hardness and is selected from the group consisting of polyamides and polyesters;
(b) positioning the surface of the coating roll a predetermined distance from an outer surface of the printing cylinder such that the fluid film contacts the outer surface and a coating gap between the outer surface of the printing cylinder and the surface of the coating roll is formed;
(c) simultaneously rotating and moving the coating roll relative to the printing cylinder in such a manner that the printing cylinder is coated with the liquid layer; and
(d) drying the liquid layer to form the coated printing cylinder.

9. The process according to claim 8, characterized in that the material of the coating roll has a Shore D hardness measured according to ASTM D 2240 of at least 60.

10. The process according to claim 8, characterized in that the coating roll material is selected from the group consisting of thermoplastic or thermosetting non-elastomeric polymers, metals, and ceramic materials.

11. The process according to claim 1, characterized in that the coating roll has a roll diameter of 90–150 mm.

12. The process according to claim 11, characterized in that the coating roll has a roll width of 10–40 mm.

13. The process according to claim 1, characterized in that the liquid is an infrared-sensitive composition.

14. The process according to claim 13, characterized in that the liquid is an infrared-ablatable composition.

15. The process according to claim 14, characterized in that the infrared-ablatable composition comprises carbon black.

16. The process according to claim 1, characterized in that the process steps (a) to (d) are repeated at least once.

17. The process according to claim 16, characterized in that for each repeat of the process steps (a) to (d) a different liquid is used.

18. A photopolymerizable flexographic printing sleeve comprising an outermost layer coated by the process according to claim 1.

* * * * *